United States Patent [19]

Yamashita

[11] 3,742,318

[45] June 26, 1973

[54] FIELD-EFFECT SEMICONDUCTOR DEVICE

[75] Inventor: Akio Yamashita, Ikeda-shi, Japan

[73] Assignee: Matsushita Electric Industrial Co., Ltd., Osaka, Japan

[22] Filed: Nov. 24, 1971

[21] Appl. No.: 201,660

[30] Foreign Application Priority Data

Nov. 26, 1970 Japan ............................. 45/104285
Nov. 30, 1970 Japan ............................. 45/106523

[52] U.S. Cl. ...... 317/235 R, 317/235 H, 317/235 B, 317/235 AB, 317/235 G

[51] Int. Cl. ............................................. H01l 9/12

[58] Field of Search ..................... 317/235 H, 235 B, 317/235 AB, 235 G

[56] References Cited

UNITED STATES PATENTS

| | | | |
|---|---|---|---|
| 3,437,891 | 4/1969 | Yamashita | 317/235 |
| 3,519,899 | 7/1970 | Yamada | 317/235 |
| 3,419,766 | 12/1968 | Ono | 317/235 |

OTHER PUBLICATIONS

Electronic Design, 9, Apr. 25, 1968, pp. 30–31.

*Primary Examiner*—Martin H. Edlow
*Attorney*—Richard K. Stevens, Robert J. Frank et al.

[57] ABSTRACT

A field-effect semiconductor device having negative resistance characteristics which are controllable by means of an electric field. The device may serve as a solid-state switch.

3 Claims, 8 Drawing Figures

FIELD-EFFECT SEMICONDUCTOR DEVICE

This invention relates to a field-effect semiconductor device adapted to serve as a solid-state switch whose negative resistance characteristics can be controlled by means of an electric field.

Conventionally, field-effect type thyristors have been proposed as semiconductor devices whose negative resistance characteristics can be controlled by means of an electric field.

It is an object of this invention to provide an improved field-effect semiconductor device having a high current capacity and stability as compared with conventional thyristors.

A further object of this invention is to provide a non-contact type switch using a field-effect type thyristor and a Hall-effect element, which is simplified in construction, can be manufactured at low cost and is capable of performing on-off switching operations.

Other objects, features and advantages of this invention will become apparent from the following description taken in conjunction with the accompanying drawings, in which.

Figure 1:
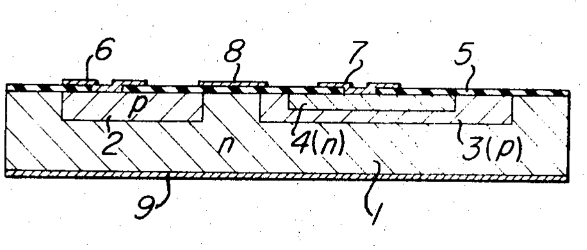
FIG. 1 is a sectional view of a field-effect semiconductor device according to this invention.

Referring to FIG. 1, there is shown an example of the device accoridng to this invention, wherein reference numeral 1 represents an n-type semiconductor substrate, numerals 2 and 3 designate p-type regions formed in the n-type semiconductor substrate 1, numeral 4 designates an p-type region formed in the n-type region 3, numeral 5 designates an insulating layer, numeral 6 designates an electrode provided for the p-type region 2, numeral 7 designates an electrode provided for the n-type region 4, numeral 8 designates an electrode provided on the insulating layer 5, and numeral 9 designates an electrode provided for the semiconductor substrate 1.

The conventional field-effect thyristors do not have the electrode 9 shown in FIG. 1. In order that the current flowing between the electrodes 6 and 7 may be on-off controlled, it is required that an electric current be used which flows through a channel occurring in the semiconductor surface under the electrode 8. In this case, however, there is a disadvantage in that such a channel current cannot be made high.

In accordance with this invention, the foregoing disadvantage is overcome by additionally providing the conventional element with the electrode 9.

Figure 2:
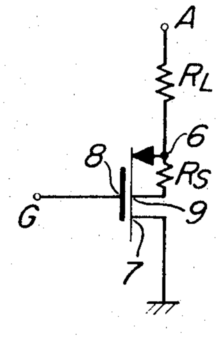
FIG. 2 is an equivalent circuit diagram of the device shown in FIG. 1.
Figure 3:
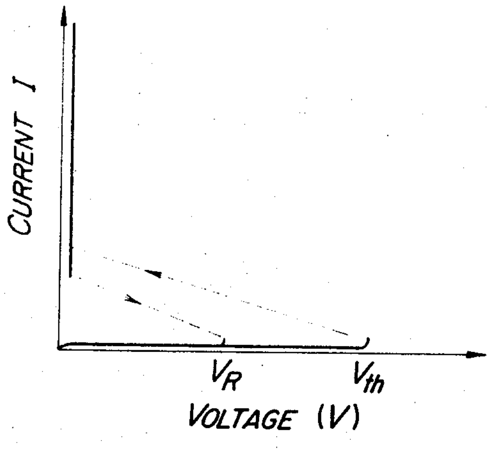
FIG. 3 is a diagram showing the voltage-current characteristics of the device shown in FIG. 1.
Figure 4:
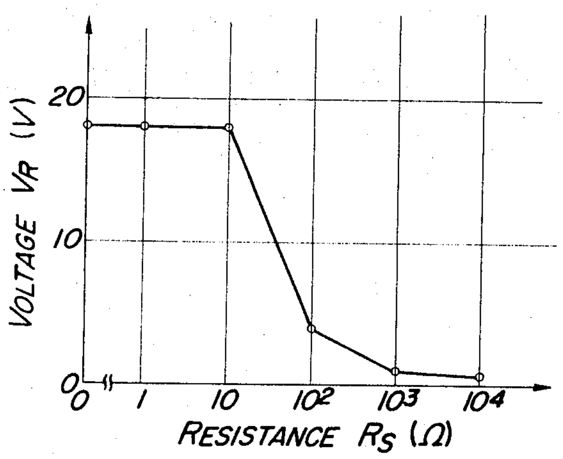
FIG. 4 is a graph showing the voltage $V_R$ versus resistance $R_s$ characteristic of the device shown in FIG. 1.
Figure 5:
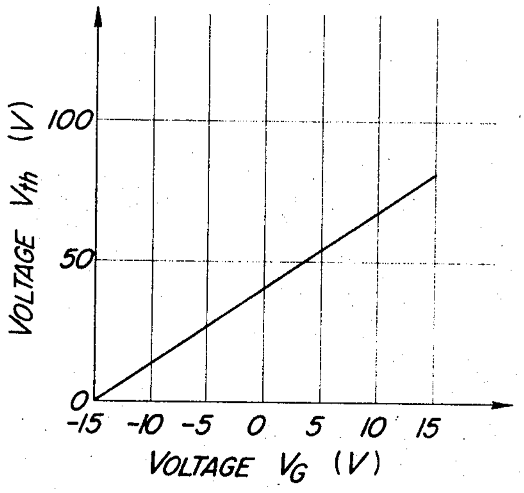
FIG. 5 is a graph of the voltage $V_{th}$ versus voltage $V_G$ characteristic of the device shown in FIG. 1.

Referring now to FIG. 2, there is shown a circuit diagram of an example of the device embodying this invention wherein a resistance $R_s$ is connected between a load resistance $R_L$ and the electrodes 6 and 9. The current-voltage characteristic occurring between the electrodes 6 and 7 is as illustrated in FIG. 3, from which it will be seen that the device is switched from the "OFF" state to the "ON" state at the point of the voltage $V_{th}$ and that the voltage is returned to $V_R$ when the device is switched from the "ON" state to the "OFF" state. The value of $V_R$ depends upon $R_s$, and as $R_s$ decreases, $V_{th}$ and $V_R$ become closer and finally agree with each other, as will be seen from FIG. 4. That is, agreement occurs between the voltage $V_R$ at which the device is switched from the "ON" state to the "OFF" state and the voltage $V_{th}$ at which the device is switched from the "OFF" state to the "ON" state. Assume now that a gate voltage is applied to the electrode 8 with $R_s$ = O, or with the electrodes 6 and 9 being short-circuited, then $V_{th}$ will vary as shown in FIG. 5. Where a positive gate voltage is applied, $V_{th}$ increase, whereas when a negative gate voltage is applied, $V_{th}$ decreases. This implies that the switch can be turned on or off with the gate voltage because $V_{th} = V_R$. It is only for the sake of explanation that the n-type and p-type regions have been particularly selected; these regions may be interchanged without modifying the operation of the device.

Figure 6:
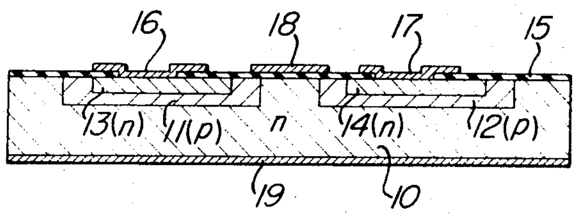
FIG. 6 is a sectional view of another embodiment of the device according to this invention.
Figure 7:
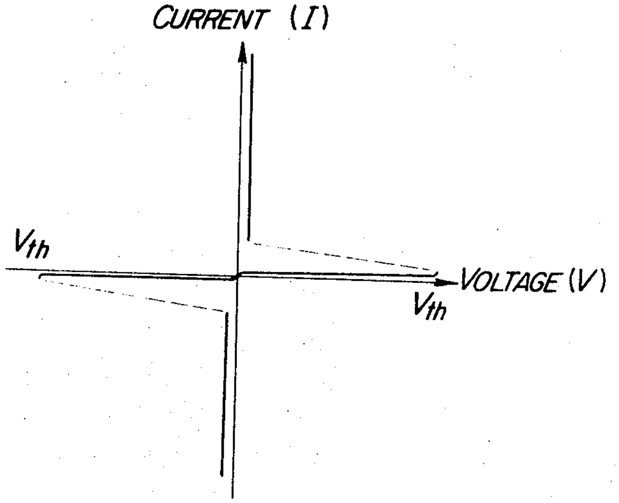
FIG. 7 is a voltage versus current characteristic of the device shown in FIG. 6.

It is also possible that the present field-effect switch may be constructed in the form of npnpn or pnpnp as shown in FIG. 6. In that case, the switch serves as a bidirectional switch. In FIG. 6, numeral 10 represents an n-type semiconductor substrate, numerals 11 and 12 designate p-type regions, numerals 13 and 14 designate n-type regions, numeral 15 designates an insulator layer, and numerals 16, 17, 18 and 19 designate electrodes respectively. With such construction, it is possible to achieve bidirectional negative resistance characteristics such as shown in FIG. 7, in the case of which $V_{th}$ is varied with the gate voltage in both directions at the same time. As the semiconductor, use may be made of Ge, Si, GaAs, GaP or InAs, all of which are well known in the art.

Description will now be made of a concrete example of the present invention, wherein such construction as shown in FIG. 1 was formed in an n-type Si semiconductor by means of a conventional impurity diffusion technique. The current-voltage characteristics observed with $R_s$ = O in such a circuit as shown in FIG. 2 exhibited negative reisstance as shown in FIG. 3, wherein $V_{th}$ and $V_R$ agree. $V_{th}$ depends upon the interjunction distance between the p-type regions, ranging from several volts to several hundreds of volts. FIG. 5 shows how $V_{th}$ varies with the gate voltage. As the insulating layer, use may be commonly made of an oxide film, nitride film or the like. With this construction, it is possible to control a current ranging from several tens of milli-amperes to several amperes. The capability of controlling such a high current is the most significant feature of this invention.

A further exmaple of this invention will be described below.

Figure 8:
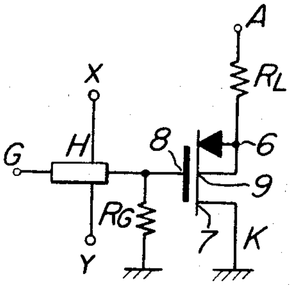
FIG. 8 is a circuit diagram of a non-contact switch according to this invention.

The device shown in FIG. 1 is connected with such a circuit as shown in FIG. 8 wherein H is a Hall effect gauge, $R_L$ and $R_G$ are resistances, A is an anode terminal, G is a gate terminal and E is a cathode terminal, and respective numerals indicate electrodes corresponding to those of FIGS. 1 and 2. A direct current is caused to flow into the Hall effect device by means of terminals X and Y.

The current-voltage characteristics appearing between the electrodes 6 and 7 are similar to those described above in connection with FIG. 3. $V_{th}$ represents the break-over voltage. The element has such a nature that it is returned from the "ON" state to the "OFF" state. By changing the resistance of the Hall element H with the aid of a magnetic field with a voltage being imparted to the gate terminal G, the voltage applied to the gate electrode 8 is varied. It has been found that the relationship between the gate voltage $V_G$ and the break-over voltage $V_{th}$ is substantially the same as the characteristics described above in connection with FIG. 5. The voltage $V_{th}$ can be increased or decreased depending upon the polarity of the gate voltage $V_G$. Thus, ON-OFF control can be achieved with the aid of a magnetic field. In this case, too, it is only for the sake of explanation that the n-type and p-type regions have particularly been determined; these regions may be interchanged. As the semiconductor, use may be made of Ge, Si, GaP, GaAs, InAs or SiC, all of which are well known in the art. The Hall effect device may be fabricated using, InSb, p-i-n Ge diode or the like.

Another concrete example of this invention will be described in detail. A field-effect thyristor having such a construction as shown in FIG. 1 was formed in an n-type Si semiconductor by means of a conventional impurity diffusion technique, and a non-contact switch having such connections as shown in FIG. 8 was constructed by the use of a Hall effect device consisting of InSb.

The field-effect thyristor was on-off controlled by changing the resistance of the Hall effect device by the use of a permanent magnet with a voltage being applied to the gate thereof. It has been found that the relationship between the break-over voltage $V_{th}$ and the gate voltage $V_G$ is substantially the same as the characteristics described above in connection with FIG. 5. Basically, the resistances $R_L$ and $R_G$ may be present or absent. The essential point is that the Hall device be connected to the gate circuit of the field effect thyristor.

As described above in detail, the field-effect semiconductor device according to this invention acts as a non-contact type switch capable of on-off ocntrol of an electric current in the range of from several tens of milli-amperes up to several amperes simply by changing the gate voltage.

Futhermore, the field-effect semiconductor device according to the present invention is light-sensitive, that is, the switching voltage can be varied by exposing the upper surface of the field-effect semiconductor device to light. Consequently, the field-effect semiconductor device according to the present invention can be used as an effective light-sensitive element.

Thus, the device of this invention has great industrial utility in that it can be used as a key-board switch since it can achieve on-off control with the aid of a magnetic field or light beam.

What is claimed is:

1. A field-effect semiconductor device comprising a semiconductor substrate of one conductivity type, first and second regions formed in one surface of said semiconductor substrate and having a conductivity type opposite to that of said semiconductor substrate, a third region formed in one of said first and second regions and having said one conductivity type, first and second electrodes connected to said first and third regions respectively, a first gate electrode provided between said first and second regions through an insulating layer, a second gate electrode formed on the opposite surface of the semiconductor substrate, and means for shorting said first electrode and said second gate electrode, the current flowing between said first and second electrodes being on-off controlled by the bias voltage applied to the first gate electrode by shorting of the first electrode and the second gate electrode.

2. A field-effect semiconductor device according to claim 1, comprising a fourth region formed in the other of said first and second regions and having a conductivity type opposite to that of said other region, and an electrode connected to said fourth region.

3. A non-contact switch comprising a field-effect semiconductor device according to claim 1 and a Hall effect device connected to said gate electrode.

* * * * *